United States Patent
Aoki

(10) Patent No.: US 6,888,380 B2
(45) Date of Patent: May 3, 2005

(54) LATCH CIRCUIT FOR LATCHING A PAIR OF COMPLEMENTARY DATA SIGNALS

(75) Inventor: Yasushi Aoki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/645,585

(22) Filed: Aug. 22, 2003

(65) Prior Publication Data

US 2004/0160834 A1 Aug. 19, 2004

(30) Foreign Application Priority Data

Aug. 22, 2002 (JP) ....................................... 2002-242403

(51) Int. Cl.[7] .............................. H03F 3/45; H03K 5/22
(52) U.S. Cl. ......................................... 327/57; 327/89
(58) Field of Search .............................. 327/51, 52, 53, 327/54, 55, 56, 57, 77, 85, 89, 65

(56) References Cited

U.S. PATENT DOCUMENTS

| | | | | |
|---|---|---|---|---|
| 4,845,675 A | * | 7/1989 | Krenik et al. | 365/203 |
| 5,600,269 A | * | 2/1997 | Song et al. | 327/52 |
| 5,821,809 A | * | 10/1998 | Boerstler et al. | 327/563 |
| 5,963,060 A | * | 10/1999 | Varadarajan et al. | 327/55 |
| 6,366,130 B1 | * | 4/2002 | Podlesny et al. | 326/95 |
| 6,507,224 B1 | * | 1/2003 | Lee et al. | 327/91 |

* cited by examiner

Primary Examiner—Tuan T. Lam
(74) Attorney, Agent, or Firm—Young & Thompson

(57) ABSTRACT

A latch circuit includes a sample section for responding to complementary clock signals to sample complementary data signals during a sample period, a latch section for latching the sampled complementary data signals on latch output nodes to transfer the same through latch output nodes during a hold period, and a precharge section for precharging the latch output nodes during the sample period. The latch circuit has a smaller dead zone including a smaller setup time and a smaller hold time.

7 Claims, 4 Drawing Sheets

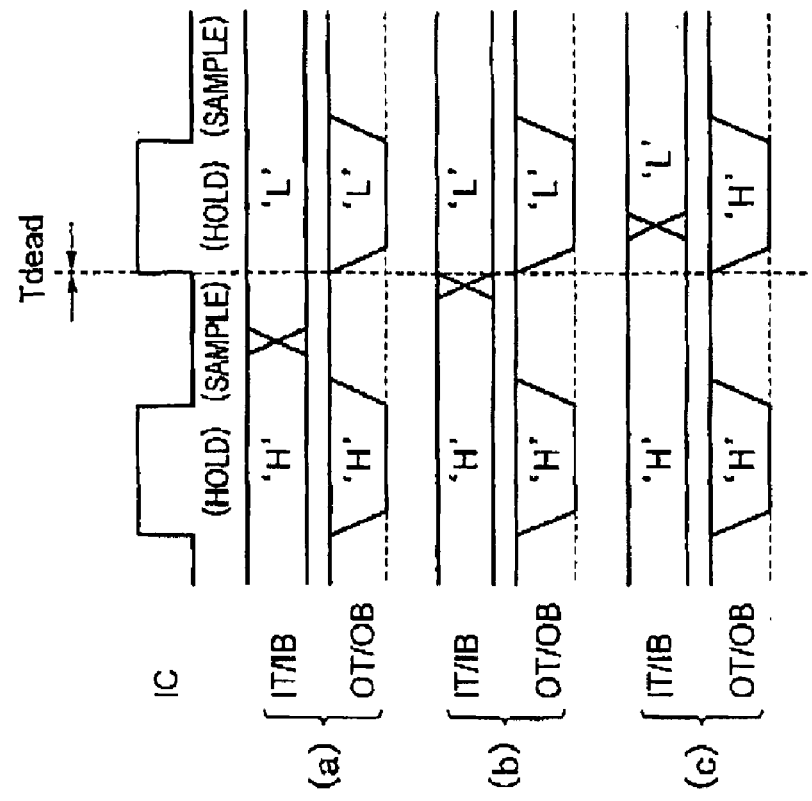
FIG. 5A CONVENTIONAL LATCH CIRCUIT
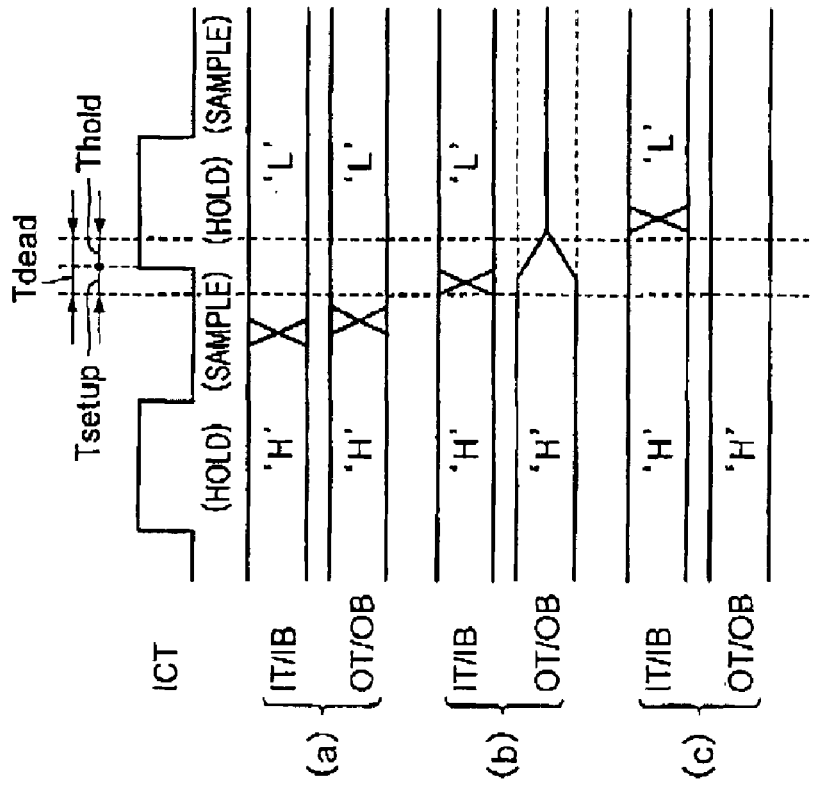
FIG. 5B EMBODIMENT

LATCH CIRCUIT FOR LATCHING A PAIR OF COMPLEMENTARY DATA SIGNALS

BACKGROUND OF THE INVENTION

(a) Field of the Invention

The present invention relates to a latch circuit for latching a pair of complementary data signals and, more particularly, to a latch circuit which responds to a pair of complementary clock signals to latch a pair of complementary data signals.

(b) Description of the Related Art

A latch circuit is known which responds to a pair of complementary clock signals to latch and transfer a pair of input complementary data signals. A CMOS circuit is generally used for such a latch circuit. FIG. 6 shows a conventional latch circuit, which is described in Patent Publication JP-A-2001-21786.

The latch circuit of FIG. 6 includes a sample section 10C activated by one of a complementary clock signals ICT and ICB to sample a pair of input complementary data signals IT and IB, and a latch section 20C activated by the other of the complementary clock signals ICT and ICB to latch the complementary data signals sampled by the sample section 10C and deliver output complementary data signals OT and OB to a next stage circuit.

The sample section 10C includes n-channel transistors (nMOSFETs) Q1 and Q4 each receiving clock signal ICB at the gate thereof, nMOSFETs Q2 and Q7 each receiving data signal IT at the gate thereof, and nMOSFETs Q3 and Q6 each receiving data signal IB at the gate thereof. The nMOSFETs Q2 and Q3 are serially connected to form a serial current path, which is connected in parallel with another serial current path formed by nMOSFETs Q6 and Q7 to thereby form a parallel current path. The parallel current path is connected to a high-potential power source line VCC via a MOSFET Q1, and to a low-potential power source line (ground line) GND via a MOSFET Q4. The sample section 10C delivers complementary data signals TC and BC through the source of MOSFET Q2, or sample output node N1, and the source of MOSFET Q6, or sample output node N2, respectively, to the latch section 20C.

The latch section 20C includes pMOSFETs Q9 and Q13, and nMOSFETs Q10 to Q12, Q14 and Q15. MOSFETs Q9 to Q12 are connected between the power source line VCC and the ground line GND in this order as viewed from the power source line VCC. MOSFETs Q13 to Q15 are connected between the power source line VCC and the drain of nMOSFET Q12 in this order as viewed from the power source line VCC. The gates of MOSFETs Q9 and Q13 receive complementary data signals BC and TC, respectively, from the sample section 10C, whereas the gate of nMOSFET Q12 receives clock signal ICT. The gate of pMOSFET Q9 is further connected to sample output node N2 connecting MOSFETs Q14 and Q15 in series, and the gate of nMOSFET Q13 is connected to sample output node N1 connecting MOSFETs Q10 and Q11 in series. The latch circuit of FIG. 6 delivers output complementary data signals OT and OB through the output node (latch output node) N3 connecting MOSFETs Q9 and Q10 in series, and the output node (latch output node) N4 connecting MOSFETs Q13 and Q14 in series, respectively. The gate of MOSFET Q11 is connected to latch output node N4 delivering therethrough output data signal OB, whereas the gate of MOSFET Q15 is connected to latch output node N3 delivering therethrough output data signal OT.

MOSFETs Q2, Q3, Q6, and Q7 of the sample section 10C constitute data input transistors for receiving input complementary data signals IT and IB and transmitting the same as complementary data signals TC and BC, whereas MOSFETs Q1 and Q4 of the sample section 10C constitute sample-section activating transistors for activating the data input transistors of the sample section 10C during a sample period of the latch circuit. MOSFETs Q9 and Q11 of the latch section 20C constitute a first inverter whereas MOSFETs Q13 and Q15 constitute a second inverter, wherein both the inverters are connected so that the input of each inverter is connected to the output of the other inverter. MOSFETs Q10 and Q14 constitute voltage-liming transistors which reduce the power source potential, and MOSFET Q12 constitutes a latch-section activating transistor for activating the latch section 20C during a hold period of the latch circuit.

In operation, the sample section 10C is activated to operate for sampling during a sample period wherein clock signals ICT and ICB assume a low level and a high level, respectively, thereby sampling the input complementary data signals IT and IB. The latch section 20C is activated during a hold period after clock signal ICT rises to a high level, to thereby latch complementary data signals TC and BC through sample output nodes N1 and N2 from the sample section 10C and deliver output complementary data signals OT and OB through latch output nodes N3 and N4 to the next stage circuit.

Thereafter, in the next sample period when clock signals ICT and ICB again assume a low level and a high level, respectively, the sample section 10C is again activated to latch new input complementary data signals IT and IB, whereby the latch section 20C again latches complementary data signals TC and BC through sample output nodes N1 and N2 in the next hold period.

If the sample section 10C samples new input complementary data signals having a data different from the data of the previous input complementary data signals, the electric charge stored on the latch output node N3 or N4 then assuming a high level is discharged via MOSFET Q12 of the latch section 20C toward the ground line GND upon the signal inversion of the output complementary data signals OT and OB, thereby allowing the output node N3 or N4 to fall toward a low level. At the same time, electric charge is injected to the latch output node N4 or N3 then assuming a low level from the power source line VCC via MOSFETs Q9 and Q13, thereby allowing the latch output node N4 or N3 to rise toward a high level.

It is to be noted that the discharge and injection of the electric charge concurrently occur during the sample period wherein the sample section 10C is activated. This causes a large energy burden on the power source lines VCC and GND, whereby the time length needed for the discharge and injection of the electric charge increases. The increased time length for the discharge and injection of the electric charge increases the time length needed for the signal inversion of the latch output node N3 and N4, thereby increasing the dead zone of the latch circuit including a setup time and a hold time thereof. This may cause a malfunction of the latch circuit in the signal transmission depending on the delivery timing of the input complementary data signals.

SUMMARY OF THE INVENTION

In view of the above problem of the conventional latch circuit, it is an object of the present invention to provide a new latch circuit which is capable of reducing the time length for the signal inversion of the output complementary data signals by reducing the energy burden on the power source lines and thus reducing the dead zone of the latch circuit.

The present invention provides a latch circuit including: a sample section activated during a sample period by a sample signal to sample a pair of complementary data signals, to deliver the complementary data signals through a pair of sample output nodes; a latch section activated during a hold period by a hold signal to latch the complementary data signals through the sample output nodes, to deliver the complementary data signals through a pair of latch output nodes, the sample signal and the hold signal occurring alternately with each other; and a precharge section for precharging the latch output nodes during the sample period.

In accordance with the latch circuit of the present invention, the precharge section precharging the latch output nodes allows the signal inversion on the latch output nodes to be effected only by discharging electric charge from one of the latch output nodes during the hold period, thereby reducing the energy burden on the power source lines. This allows a higher-speed signal inversion of the complementary data signals, to thereby reduce the dead zone of the latch circuit including a setup time and a hold time thereof compared to the conventional latch circuit wherein both the discharge and injection occur concurrently during the sample period.

It is to be noted that the dead zone of the latch circuit is determined by the time length needed for updating the previous data stored in the latch circuit by a new data. If the time length needed for the signal inversion is short, the dead zone is small, whereas if this time length is long, the dead zone is large. In the latch circuit of the present invention, since the previous data stored in the latch circuit is first discarded by the precharge section during the sample period to allow the latch circuit to assume a neutral state, the energy needed for update of the data is thereby reduced to reduce the time length for the update of data. Thus, the dead zone of the latch circuit can be reduced.

The above and other objects, features and advantages of the present invention will be more apparent from the following description, referring to the accompanying drawings.

BRIEF DESCRIPTION OF THE DRAWINGS

FIG. 5A shows timing charts of the signals in the conventional latch circuit and FIG. 5B show timing charts of the signals in the latch circuit of the first embodiment, each of FIGS. 5A and 5B illustrating different delivery timings of the input complementary data signals in the cases (a), (b) and (c).

PREFERRED EMBODIMENTS OF THE INVENTION

Figure 1:
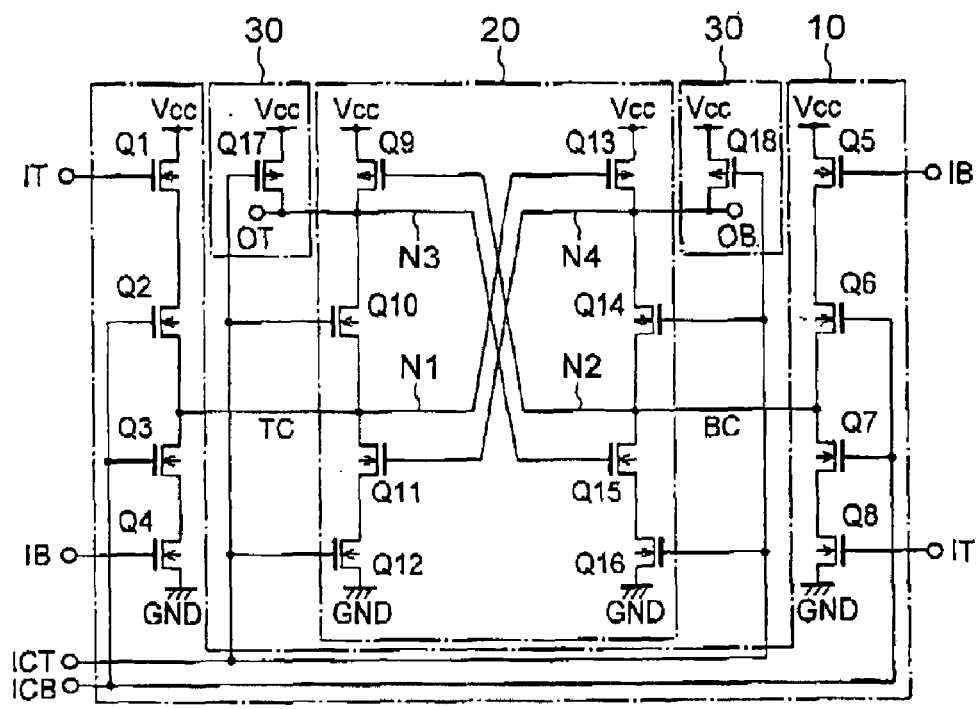
FIG. 1 is a circuit diagram of a latch circuit according to a first embodiment of the present invention.

Now, the present invention is more specifically described with reference to accompanying drawings, wherein similar constituent elements are designated by similar reference numerals.

Referring to FIG. 1, a latch circuit according to a first embodiment of the present invention includes a sample section 10 for responding to a pair of complementary clock signals ICT and ICB to sample a pair of input complementary data signals IT and IB, a latch section 20 for latching the complementary data signals sampled by the sample section 10 to transmit the same to a next stage circuit (not shown), and a precharge section 30 for precharging the output nodes N3 and N4 of the latch section (referred to as latch output nodes N3 and N4) during a sample period.

The sample section 10 includes a first data input block including four n-channel transistors (nMOSFETs) Q1 to Q4 connected in series from the high-potential power source line VCC to the low-potential power source line GND consecutively in the recited order, a second data input block including four nMOSFETs Q5 to Q8 connected in series from the high-potential power source line VCC to the low-potential power source line GND consecutively in the recited order. One of the input complementary data signals IT and IB is delivered to the gates of data input transistors Q1 and Q8, whereas the other of the input complementary data signals IT and IB is delivered to the gates of data input transistors Q4 and Q5.

Clock signal ICB assuming a high level during a sample period is applied to the gates of sample-section activating transistors Q2, Q3, Q6 and Q7. A node N1 connecting the sample-section activating transistors Q2 and Q3 in series constitutes one of sample output nodes, which transmits output data signal TC of the sample section 10 to the latch section 20, whereas a node N2 connecting sample-section activating transistors Q6 and Q7 in series constitutes the other of the sample output nodes, which transmits output data signal BC of the sample section 10 to the latch section 20.

The latch section 20 includes p-channel transistors (pMOSFETs) Q9 and Q13, and nMOSFETs Q10 to Q12 and Q14 to Q16. Transistors Q9 and Q11 as well as transistors Q13 and Q15 constitute a CMOS inverter. Transistors Q9 to Q12 are connected in series from the high-potential power source line VCC to the low-potential power source line GND consecutively in the recited order. Similarly, transistors Q13 to Q16 are connected in series from the high-potential power source line VCC to the low-potential power source line GND consecutively in the recited order. Output complementary data signals TC and BC of the sample section 10 are delivered through the sample output nodes N1 and N2 to the gates of transistors Q13 and Q9, respectively.

The gate of transistor Q15 is connected to latch output node N3 connecting transistors Q9 and Q10 in series, whereas the gate of transistor Q11 is connected to latch output node N4 connecting transistors Q13 and Q14 in series. Clock signal ICT assuming a high level during a hold period is delivered to the gates of transistors Q10, Q12, Q14 and Q16. Transistors Q12 and Q16 are turned ON during a hold period and constitute latch-section activating transistors which activate the CMOS inverters. Transistors Q10 and Q14 are turned OFF during a sample period and constitute cut-off transistors, which isolate sample output nodes N1 and N2 from latch output nodes N3 and N4, respectively. Provision of the cut-off transistors allows an effective precharge operation onto the latch output nodes N3 and N4.

The precharge section 30 includes p-channel transistors (pMOSFETs) Q17 and Q18. Transistor Q17 is connected between the high-potential power source line VCC and sample output node N3, and has a gate receiving clock signal ICT which assumes a low level during a sample period. Transistor Q18 is connected between the high-potential power source line VCC and sample output node N4, and has a gate receiving clock signal ICT which assumes a low level during a sample period.

In operation, the sample section 10 is activated during a sample period, wherein clock signals ICT and ICB assume a low level and a high level, respectively, to turn ON sample-section activating transistors Q2, Q3, Q6 and Q7. In other words, the sample section 10 operates for sampling at this period to sample input complementary data signals IT and IB. In the next hold period, wherein clock signals ICT and ICB assume a high level and a low level, respectively, the sample section 10 is inactivated to hold the sampled complementary data signals IT and IB on the sample output nodes N1 and N2 as complementary data signals TC and BC. The latch section 20 is activated at this stage due to the transistors Q10, Q12, Q14 and Q16 being turned ON. The latch section 20 latches the complementary data signals TC and BC to deliver the same as output complementary data signals OT and OB through the latch output nodes N3 and N4 to the next stage circuit.

In the next sample period wherein complementary clock signals ICT and ICB assume a low level and a high level, respectively, the sample section 10 samples next input complementary data signals IT and IB. Transistors Q17 and Q18 of the precharge section 30 are turned ON at this stage wherein clock signal ICT assumes a low level, thereby injecting electric charge to the latch output nodes N3 and N4 from the high-potential power source line VCC. This allows both the latch output nodes N3 and N4 to be precharged up to a high level, irrespective of whether the data signals stored on the latch output nodes N3 and N4 are "1" (high level) or "0" (low level). Transistor Q10 is turned OFF at this sample period, thereby isolating latch output node N3 from sample output node N1. Similarly, transistor Q14 is turned OFF at this sample period, thereby isolating latch output node N4 from sample output node N2. This precharge operation allows both the latch output nodes N3 and N4 to assume a substantially equal high-level potential.

Subsequently, in the next hold period wherein complementary clock signals ICT and ICB assume a high level and a low level, respectively, the sample section 10 is inactivated, the latch section 20 is activated, and the precharge section 30 stops its precharge operation. Thus, the sample section 10 delivers its output complementary data signals TC and BC to the latch section 20 through the sample output nodes N1 and N2, respectively. The latch section 20 latches the complementary data signals TC and BC due to the flip-flop function of transistors Q9 to Q16, whereby the potential of one of the latch output nodes N3 and N4 is lowered from the high level to a low level with the potential of the remaining node being unchanged.

In the present embodiment, both the latch output nodes N3 and N4 are precharged to a high level by using clock signal ICT assuming a high level during the sample period. Accordingly, during the next hold period wherein the latch section 20 is activated to latch the complementary data signals TC and BC, it is sufficient for the latch section 20 to effect the signal inversion by lowering one of the latch output nodes N3 and N4 without raising the other of the latch output nodes N3 and N4. More specifically, since both the latch output nodes N3 and N4 assume a high level before the hold period due to the precharge, the signal inversion can be effected by lowering one of the latch output nodes N3 and N4 with the other of the latch output nodes N3 and N4 being unchanged. This alleviates the energy burden on the power source lines VCC and GND, whereby the dead zone can be reduced in the latch circuit of the present embodiment, as detailed hereinafter.

Referring to FIGS. 5A and 5B, there are shown timing charts of the conventional latch circuit and the latch circuit of the present embodiment for different cases of (a), (b) and (c). In FIG. 5, clock signal ICT defines the switch timing between the sample period and the hold period, wherein (a), (b) and (c) show different cases for the delivery timing of the input complementary data signals IT and IB with respect to the timing of clock signal ICT. In either case, the complementary data signals on the sample output nodes N1 and N2 are latched at the rising edge of clock signal ICT for starting the hold period.

In the case (a) of the conventional latch circuit, the input complementary data signals IT and IB are supplied at a suitable timing during the sample period, whereby output complementary data signals OT and OB on the latch output nodes N3 and N4 are switched at the switch timing of the input complementary data signals IT and IB during the sample period and then suitably latched at the rising edge of clock signal ICT for starting the hold period.

In the case (b) of the conventional latch circuit, since the input complementary data signals IT and IB are delivered with a significant delay just before the end of the sample period and thus within the dead zone ($T_{dead}$) of the latch circuit, the output complementary data signals OT and OB assume a median potential level between the high level and the low level. Thus, the conventional latch circuit has an error in the data transmission. As shown in FIG. 5A, the dead zone $T_{dead}$ includes a setup time $T_{setup}$ and a hold time $T_{hold}$.

In the case (c) of the conventional latch circuit, since the input complementary data signals IT and IB are delivered with a larger delay and outside the hold time $T_{hold}$ after clock signal ICT is switched for the hold period, the complementary data signals OT and OB are not switched although this is not an error of the latch circuit. As understood from the case (b), the conventional latch circuit is susceptible to the delay of the input data signals due to the larger dead zone $T_{dead}$ including the setup time $T_{setup}$ and the hold time $T_{hold}$.

In the cases (a), (b) and (c) of the present embodiment, both the sample output nodes N1 and N2 for transferring therethrough complementary data signals OT and OB are precharged during the sample period, and the signal transition on one of the sample output nodes N1 and N3 is effected at the rising edge of clock signal ICT for starting the hold period. Thus, as shown in the case (a) of the present embodiment, if the input complementary data signals IT and OB are delivered at a suitable timing during the sample period, a suitable signal transition is effected at the next hold period. In the case (b) of the present embodiment, even if the input complementary data signals IT and IB are delivered with a significant delay, signal transition of output complementary data signals OT and OB is suitably effected so long as the signal transition of input complementary data signals IT and IB is completed before the rising edge of clock signal ICT for starting the hold period. This is because the precharge of the sample output nodes N1 and N2 alleviates the energy burden on the power source lines by allowing the power source lines to effect the signal transition only by discharge of the electric charge from one of the latch output nodes N3 and N4 assuming a high level, and thus allows the signal transition to be completed at a higher speed due to the alleviation of energy burden. This means reduction of the setup time $T_{setup}$ and thus the dead zone $T_{zone}$ of the latch circuit as illustrated in FIG. 5B.

If the input complementary data signals IT and IB are delivered after the rising edge of clock signal ICT for starting the hold period, as in the case (c) of the present embodiment, since clock signal ICT inactivates the sample section 10 during the hold period, complementary data signals OT and OB on the latch output nodes N3 and N4 assume the previous complementary data signals OT and OB. Thus, the latch circuit of the present embodiment reduces the dead zone $T_{dead}$ including the setup time $T_{setup}$ and hold time $T_{hold}$.

Figure 2:
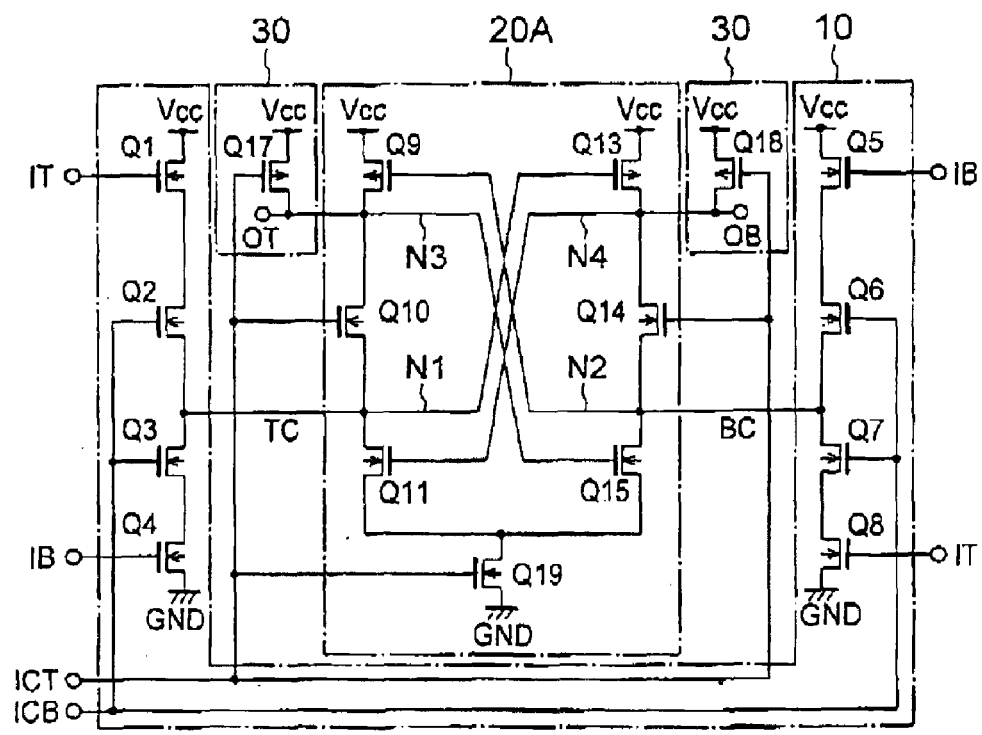
FIG. 2 is a circuit diagram of a latch circuit according to a second embodiment of the present invention.

Referring to FIG. 2, a latch circuit according to a second embodiment of the present invention is similar to the first embodiment except that the latch section 20A of the present embodiment includes a common activating transistor Q19 instead of activating transistors Q12 and Q16 in the first embodiment. The activating transistor Q19 is connected between the nodes connecting the sources of transistors Q11 and Q15 in common and the low-potential power source line GND, and activates both the CMOS inverters during the hold period. The second embodiment has an advantage in that the number of transistors is reduced compared to the first embodiment.

Figure 3:
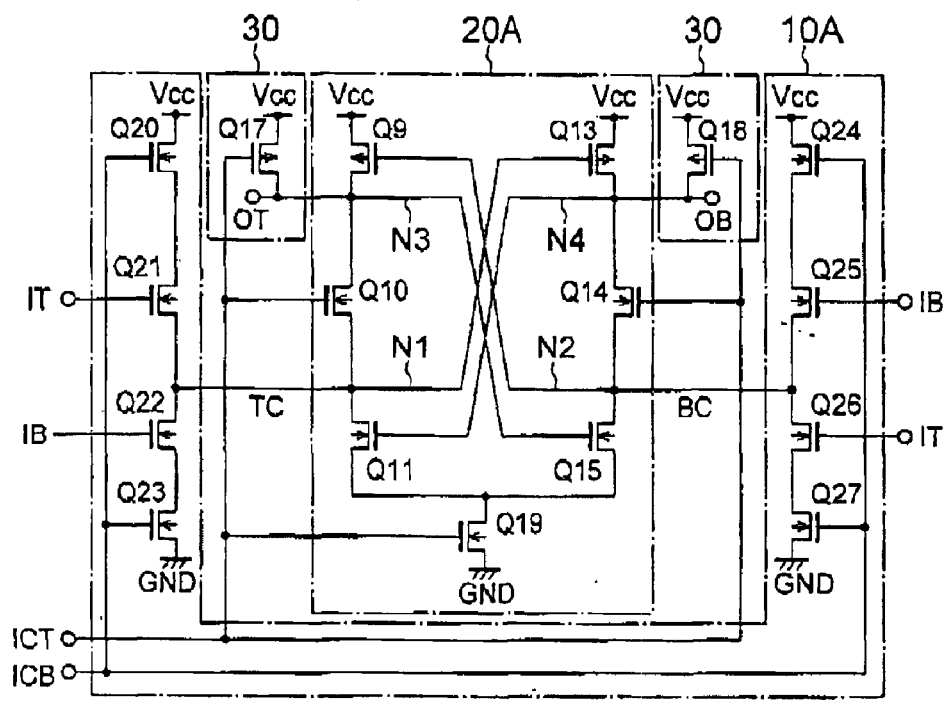
FIG. 3 is a circuit diagram of a latch circuit according to a third embodiment of the present invention.

Referring to FIG. 3, a latch circuit according to a third embodiment of the present invention is similar to the second embodiment except that the sample section 10A of the present embodiment includes data input transistors Q21 and Q22 connected in series between sample-section activating transistors Q20 and Q23, and data input transistors Q25 and Q26 connected in series between sample-section activating transistors Q24 and Q27. As in the present embodiment, the order of the arrangement of the transistors including data input transistors and sample-section activating transistors may be selected without affecting the function of the latch circuit.

Figure 4:
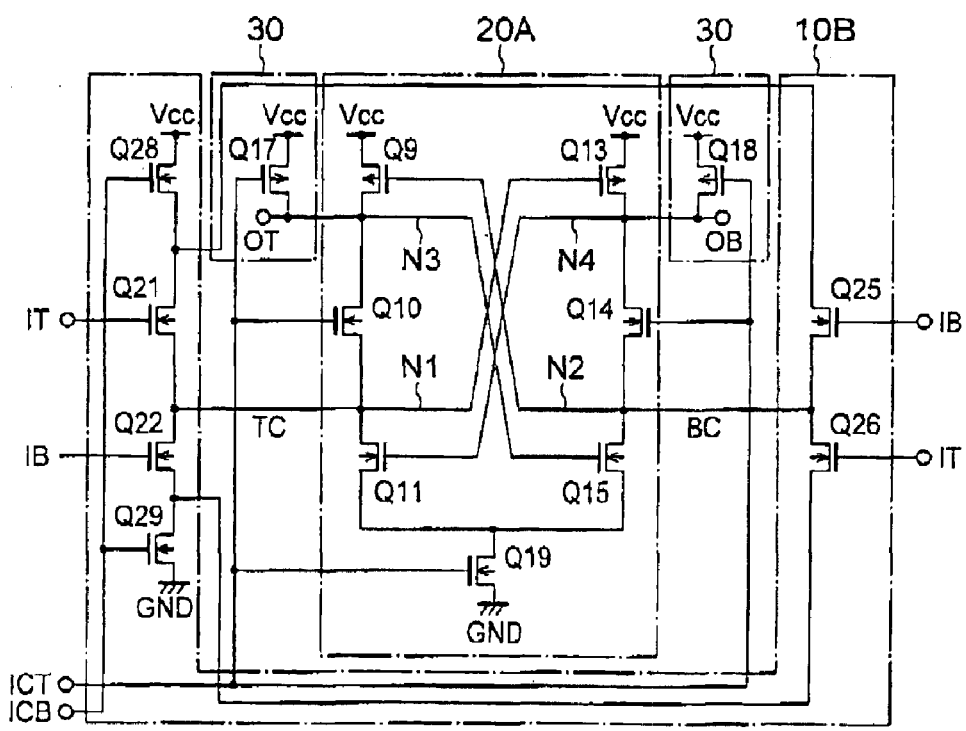
FIG. 4 is a circuit diagram of a latch circuit according to a fourth embodiment of the present invention.
Figure 6:
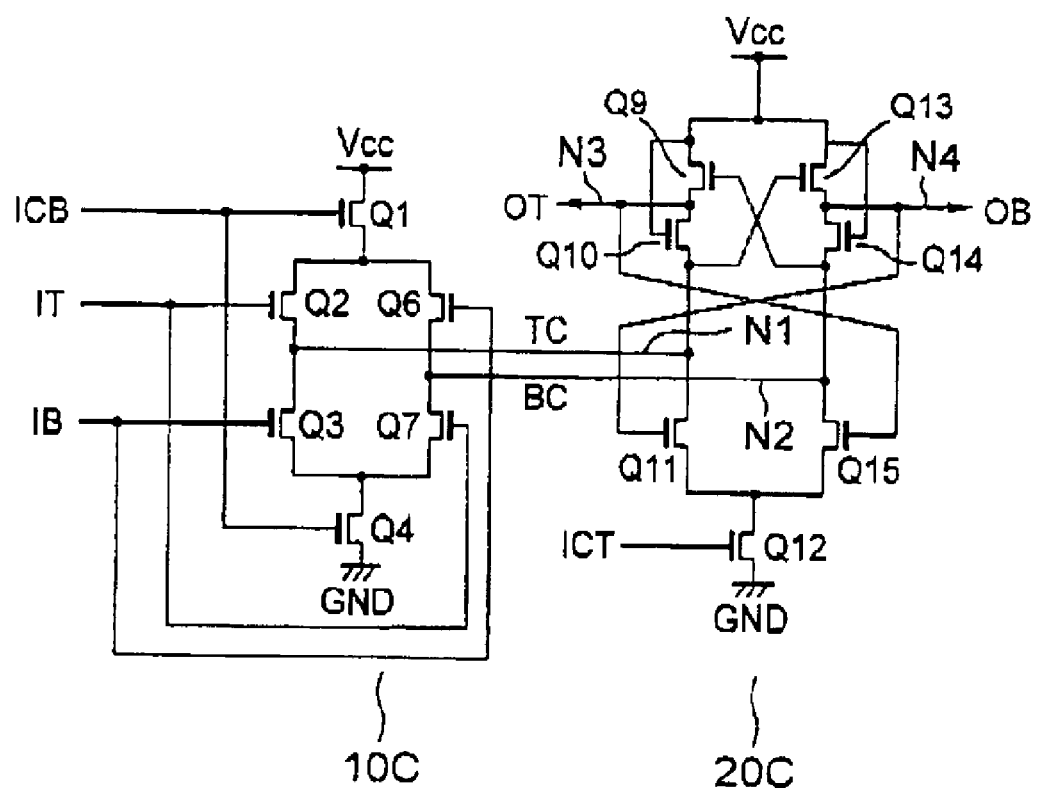
FIG. 6 is a circuit diagram of a conventional latch circuit.

Referring to FIG. 4, a latch circuit according to a fourth embodiment of the present invention is similar to the third embodiment except that the sample section 10B of the present embodiment includes a common activating transistor Q28 for activating both the data input blocks instead of the activating transistors Q20 and Q24 in the third embodiment and a common activating transistor Q29 for activating both the data input blocks instead of the activating transistors Q23 and Q27 in the third embodiment. More specifically, transistor Q28 is connected between the high-potential power source line VCC and the node connecting transistors Q21 and Q25 in common, whereas transistor Q29 is connected between the low-potential power source line GND and the node connecting transistors Q22 and Q26 in common. The other configuration and the function of the fourth embodiment are similar to those of the third embodiment.

In each of the latch circuits of the above embodiments, the precharge section 30, which precharges the sample output nodes N1 and N2 during the sample period, allows the signal transition (or signal inversion) on the latch output nodes N3 and N4 to be effected only by discharging electric charge from one of the latch output nodes N3 and N4. This reduces the energy burden on the power source lines VCC and GND during the hold period to thereby accelerate the signal transition on the output nodes of the latch circuit, and thus reduces the dead zone of the latch circuit.

In a phase comparator used in a clock-data recovery circuit in a communication device, it is desired to improve the accuracy of the phase comparison to reduce the data error rate. Thus, a latch circuit having a smaller dead zone is desired. The latch circuit of the present invention can be suitably used as a phase comparator in the clock data recovery circuit for reducing the data error rate.

Since the above embodiments are described only for examples, the present invention is not limited to the above embodiments and various modifications or alterations can be easily made therefrom by those skilled in the art without departing from the scope of the present invention. For example, the conductivity type and the kinds of the transistors described in the embodiments are only examples, and may be selected as desired.

What is claimed is:

1. A latch circuit comprising:

a sample section activated during a sample period by a sample signal to sample a pair of complementary data signals, to deliver said complementary data signals through a pair of sample output nodes;

a latch section activated during a hold period by a hold signal to latch said complementary data signals through said sample output nodes, to deliver said complementary data signals through a pair of latch output nodes, said sample signal and said hold signal occurring alternately with each other; and a precharge section for precharging said latch output nodes during said sample period, wherein:

said latch section includes first and second inverters for receiving said complementary data signals through said sample output nodes, and a latch-section activating circuit for activating said first and second inverters during said hold period;

said first inverter includes a first transistor having a gate connected to one of said sample output nodes and connected between a high-potential power source line and one of said latch output nodes, a second transistor connected between said one of said latch output nodes and the other of said sample output nodes and being OFF during said sample period, and a third transistor having a gate connected to the other of said latch output nodes and connected between said other of said sample output nodes and a low-potential power source line; and said second inverter includes a fourth transistor having a gate connected to said other of said sample output nodes and connected between said high-potential power source line and said other of said latch output nodes, a fifth transistor connected between said other of said latch output nodes and said one of said sample output nodes and being OFF during said sample period, and a sixth transistor having a gate connected to said one of said latch output nodes and connected between said one of said sample output nodes and said low-potential power source line.

2. The latch circuit according to claim 1, wherein said latch-section activating circuit includes a seventh transistor connected between said third transistor and said low-potential power source line and being ON during said hold period, and an eighth transistor connected between said sixth transistor and said low-potential power source line and being ON during said hold period.

3. The latch circuit according to claim 1, wherein said latch-section activating circuit includes a seventh transistor connected between a node connecting said third transistor and said sixth transistor in common and said low-potential power source line and being ON during said hold period.

4. The latch circuit according to claim 1, wherein:

said sample section includes first and second data signal input blocks;

said first data signal input block includes seventh and eighth transistors connected in series between said high-potential power source line and said one of said sample output nodes, said seventh transistor having a gate receiving one of said complementary data signals, said eighth transistor being ON during said sample period, and ninth and tenth transistors connected in series between said low-potential power source line and said one of said sample output nodes, said ninth transistor having a gate receiving the other of said complementary data signals, said tenth transistor being ON during said sample period; and said second data signal input block includes eleventh and twelfth transistors connected in series between said high-potential power source line and said other of said sample output nodes, said eleventh transistor having a gate receiving said other of said complementary data, signals, said twelfth transistor being ON during said sample period, and thirteenth and fourteenth transistors connected in series between said low-potential power source line and said other of said sample output nodes, said thirteenth transistor having a gate receiving said one of said complementary data signals, said fourteenth transistor being ON during said sample period.

5. The latch circuit according to claim 1, wherein:

said sample section includes first and second data signal input blocks, and a sample-section activating block for activating said first and second data signal input blocks during said sample period;

said first data signal input block includes seventh transistor connected between said high-potential power source line and said one of said sample output nodes and having a gate receiving one of said complementary data signals, and an eighth transistor connected between said low-potential power source line and said one of said sample output nodes and having a gate receiving the other of said complementary data signals; and said second data signal input block includes ninth transistor connected between said high-potential power source line and said other of said sample output nodes and having a gate receiving said other of said complementary data signals, and a tenth transistor connected between said low-potential power source line and said other of said sample output nodes and having a gate receiving said one of said complementary data signals.

6. The latch circuit according to claim 5, wherein said sample-section activating block includes an eleventh transistor connected in series with said seventh transistor between said high-potential power source line and said one of said sample output nodes and being ON during said sample period, a twelfth transistor connected in series with said eighth transistor between said low-potential power source line and said one of said sample output nodes and being ON during said sample period, a thirteenth transistor connected in series with said ninth transistor between said high-potential power source line and said other of said sample output nodes and being ON during said sample period, and a fourteenth transistor connected in series with said tenth transistor between said low-potential power source line and said other of said sample output nodes and being ON during said sample period.

7. The latch circuit according to claim 5, wherein said sample-section activating block includes an eleventh transistor connected between a node connecting said seventh transistor and said ninth transistor in common and said high-potential power source line and being ON during said sample period, and a twelfth transistor connected between a node connecting said eighth transistor and said tenth transistor in common and said low-potential power source line and being ON during said sample period.

* * * * *